United States Patent [19]
Kim et al.

[11] Patent Number: 6,147,896
[45] Date of Patent: Nov. 14, 2000

[54] NONVOLATILE FERROELECTRIC MEMORY USING SELECTIVE REFERENCE CELL

[75] Inventors: Shi-Ho Kim; Bo-Woo Kim; Byoung-Gon Yu; Won-Jae Lee, all of Taejon, Rep. of Korea

[73] Assignee: Electronics and Telecommunications Research Institute, Taejon, Rep. of Korea

[21] Appl. No.: 09/429,752

[22] Filed: Oct. 28, 1999

[30]       Foreign Application Priority Data

Nov. 26, 1998  [KR]    Rep. of Korea ................. 1998-51099

[51] Int. Cl.[7] ................................................. G11C 11/22
[52] U.S. Cl. .......................................... 365/145; 365/210
[58] Field of Search ................................... 365/145, 149, 365/210, 205, 207, 208

[56]             References Cited

U.S. PATENT DOCUMENTS

| | | | |
|---|---|---|---|
| 4,873,664 | 10/1989 | Eaton, Jr. ................................. | 365/145 |
| 5,262,982 | 11/1993 | Brassington et al. ................... | 365/145 |
| 5,412,596 | 5/1995 | Hoshiba ................................... | 365/145 |
| 5,682,344 | 10/1997 | Seyyedy ................................... | 365/145 |
| 5,764,561 | 6/1998 | Nishimura ................................ | 365/145 |

OTHER PUBLICATIONS

Tasumi et al., "A 256kb Nonvolatile Ferroelectric Memory at 3V and 100ns," *IEEE International Solid–State Circuits Conference*, pp. 268–269, Feb. 1994.

Tanabe et al., "A High Density 1T/2C Cell with Vcc/2 Reference Level for High Stable FeRAMs," *IEEE IEDM*, pp. 863–866, Dec. 1997.

Yamada et al., "A Self–Reference Read Scheme for a 1T/1C FeRAM," *1998 Symposium on VLSI Circuits Digest of Technical Papers*, pp. 238–241, Jun. 1998.

*Primary Examiner*—Son Mai
*Attorney, Agent, or Firm*—E. Russell Tarleton; Seed IP Law Group PLLC

[57]            ABSTRACT

A nonvolatile ferroelectric memory that reduces the number of cycles of reference cells to extend lifetime of memory. A reference cell of the memory is activated to provide a reference voltage to a sense amplifier only when the sense amplifier needs the reference voltage. The memory comprises a plurality of cells arranged in a matrix form and including memory cells and reference cells, and a plurality of sense amplifiers arranged in a row of the matrix, in which each sense amplifier compares voltages induced from a reference cell and a selected memory cell to read information stored in the selected memory cell, and in which each reference cell is activated only when both a selection signal from a column address and a word line connected to said reference cell are enabled.

11 Claims, 6 Drawing Sheets

NONVOLATILE FERROELECTRIC MEMORY USING SELECTIVE REFERENCE CELL

TECHNICAL FIELD

The present invention relates to nonvolatile ferroelectric memory and more specifically to nonvolatile ferroelectric memory with improved structure of reference cells.

BACKGROUND OF THE INVENTION

Ferroelectric material exhibits a hysteresis characteristic and is capable of retaining polarization states even when power is removed from the material. Ferroelectric thin film capacitors have been used as bit storage components. FIG. 1 shows a graph for illustrating a hysteresis characteristic curve of conventional ferroelectric film.

There are two available structures for conventional ferroelectric memory cells. FIG. 2 is a circuit diagram showing a conventional 2T2C ferroelectric memory cell, which is composed of two MOS transistors and two storage capacitors 20 and 21. FIG. 3 is a circuit diagram showing a conventional 1T1C ferroelectric memory cell, which is composed of one MOS transistor and one storage capacitor 30.

Using the 2T2C ferroelectric memory cell structure, any reference cell is not needed in Write/Read operations because one-bit information comprised of a series of digits 0 and 1 is read from and stored into two storage capacitors 20 and 21 through a bit line BL and a complimentary bit line $\overline{BL}$. But, since two storage cells are needed in order to store one-bit information, the density of integration is lower than conventional 1T1C structure.

As shown in FIG. 3, cell structure of the 1T1C ferroelectric memory is similar to conventional DRAM (dynamic random access memory). But reference cells are needed to read information from a ferroelectric capacitor 30.

FIG. 4 is a circuit diagram showing a structure of conventional 1T1C ferroelectric memory cells. When one of word lines $WL_0$ through $WL_1$ connected to the memory cells is selected, one of word lines $RWL_0$ and $RWL_1$ connected to the reference cells has to be selected by the following rule. If an even numbered memory cell word line $WL_0$, . . . or $WL_{n-1}$ is selected, complimentary bit lines ($\overline{BL}$) 41a and 42a connected to the memory cells associated with the selected word line $WL_0$, . . . or $WL_{n-1}$ are activated depending on the charge of each storage capacitor Cs. At this time, one reference cell word line $RWL_1$ has to be selected to supply the reference voltage to bit lines (BL) 41b and 42b depending on the charge of each reference capacitor Cr. Each sense amplifier 41 (or 42) compares voltage levels of a pair of bit lines 41a and 41b (or 42a and 42b), and then amplifies the voltage difference in order to read and determine whether the information stored in each memory cell is "1" or "0".

On the other hand, if an odd numbered memory cell word line $WL_1$, . . . or $WL_n$ is selected, bit lines (BL) 41b and 42b connected to the memory cells associated with the selected word line $WL_1$, . . . or $WL_n$ are activated depending on the charge of each storage capacitor Cs. At this time, the other reference cell word line $RWL_0$ is selected to supply the reference voltage to complementary bit lines ($\overline{BL}$) 41a and 42a depending on the charge of each reference capacitor Cr. Each sense amplifier 41 (or 42) compares voltage levels of a pair of bit lines 41a and 41b (or 42a and 42b), and then amplifies the voltage difference in order to read and determine whether the information stored in each memory cell is "1" or "0".

Therefore, whenever any one of the memory cell word lines $WL_0$ through $WL_n$ is selected, one of the reference cell word lines $RWL_0$ and $RWL_1$ is selected, and then all of the reference cells associated with the selected word line $RWL_0$ or $RWL_1$ are activated. It is not required, however, that all of the sense amplifiers 41 and 42 are operated to obtain the voltage difference. This unnecessary activation of reference cells increases fatigue accumulated in the reference capacitor Cr that is a ferroelectric capacitor, and then distortion occurs in the hysteresis characteristic curve as shown FIG. 1. This results in deterioration of the ferroelectric film's lifetime. Lifetime of ferroelectric film is approximately $10^{12} \sim 10^{15}$ cycles.

In the structure of conventional ferroelectric memory cells, reference cells experience more voltage cycles than storage cells Cs and therefore the overall lifetime of the memory is significantly reduced.

SUMMARY OF THE INVENTION

A nonvolatile ferroelectric memory that reduces number of voltage cycles of reference cells to extend lifetime of memory is provided. A reference cell of the memory is activated to provide a reference voltage to a sense amplifier only when the sense amplifier needs the reference voltage.

The memory comprises a plurality of cells arranged in a matrix form and including memory cells and reference cells, and a plurality of sense amplifiers arranged in a row of the matrix, in which each sense amplifier compares voltages induced from a reference cell and a selected memory cell to read information stored in the selected memory cell, and in which the reference cells are activated by a selection signal from a column address.

Each row of reference cells may be connected to a word line, through which a selection signal is supplied to the associated reference cells, and each reference cell is activated only when both selection signals from the column address and through the word line are enabled.

Preferably, each reference cell comprises a ferroelectric capacity, a transistor operating to provide a voltage to the sense amplifier depending on the charge of the ferroelectric capacity, and a logic AND gate operating to turn on the transistor only when both selection signals from the column address and through the word line are enabled.

It is also preferred that each reference cell comprises a ferroelectric capacity, a first transistor operating to provide a voltage to the sense amplifier depending on the charge of the ferroelectric capacity, and a second transistor operating to turn on the first transistor only when both selection signals from the column address and through the word line are enabled.

Each column of the matrix can be comprised of a sense amplifier, two reference cells, a plurality of memory cells and a pair of bit lines connected to the sense amplifier, in which the sense amplifier receives a voltage from a selected memory cell through one of the bit lines and a voltage from a selected reference cell through the other of the bit lines.

Preferably, one half of the memory cells are connected to one of the bit lines, the other half of the memory cells are connected to the other of the bit lines, wherein one of the reference cells is connected to one of the bit lines, the other of the reference cells is connected to the other of the bit lines.

BRIEF DESCRIPTION OF THE DRAWINGS

The embodiments of the present invention will be explained with reference to the accompanying drawings, in which.

DETAILED DESCRIPTION OF THE INVENTION

Figure 5:
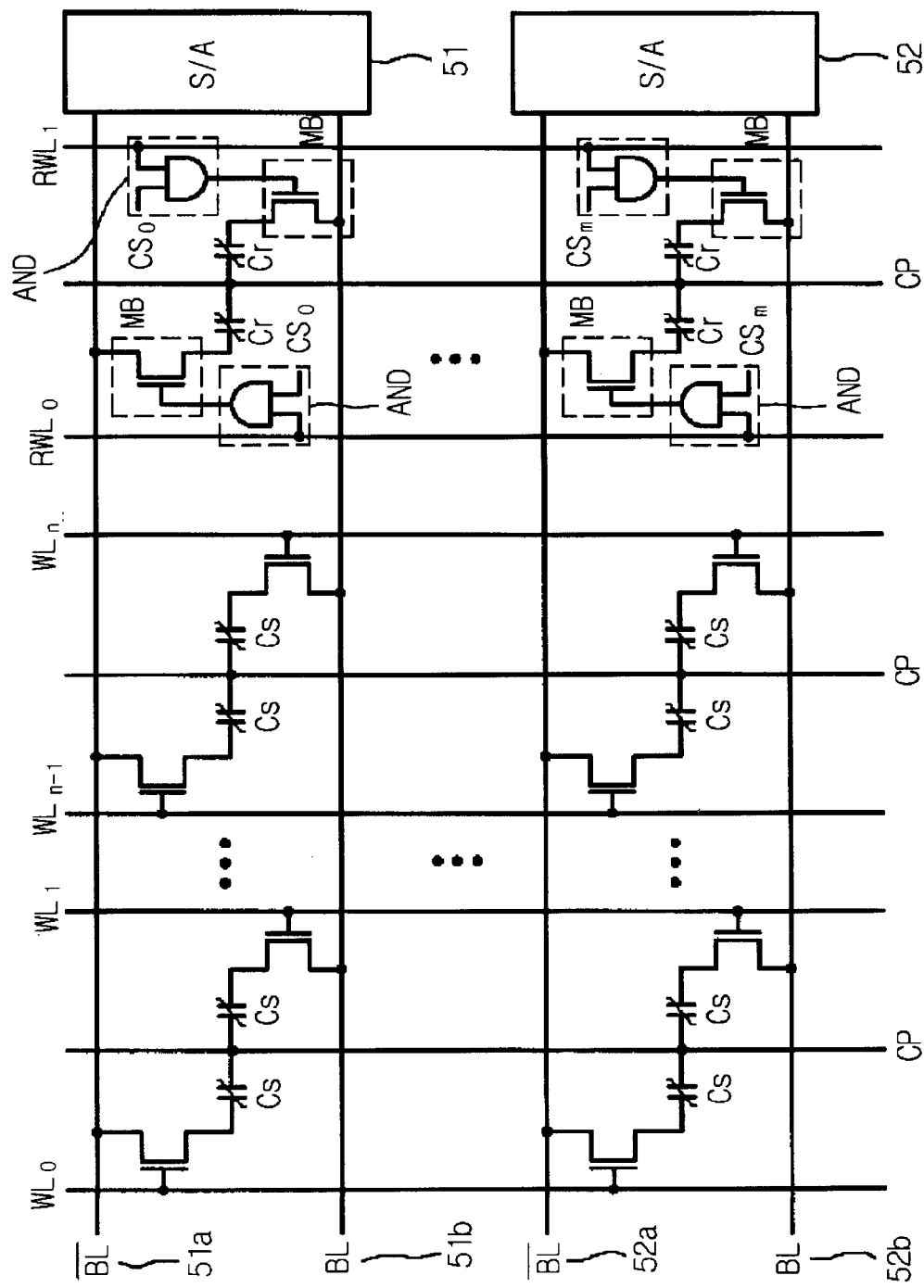
FIG. 5 shows a schematic diagram illustrating a ferroelectric memory array in accordance with an embodiment of the present invention.

As shown in FIG. 5, a ferroelectric memory array in accordance with a preferred embodiment of the present invention comprises a plurality of memory cells arranged in a matrix form. A sense amplifier and two reference cells are provided to each column of the memory cell matrix. Each column of the memory cell matrix has two bit lines comprised of a bit line BL and a complimentary bit lines $\overline{BL}$. Each row of the memory cell matrix has a word line $WL_i$. Each row of the reference cells has a word line $RWL_i$. Adjacent tow rows of cells have a complementary structure to each other. This paired rows have a ccpacity plate CP in common.

Each memory cell comprises a selection transistor such as a MOS transistor and a storage ferroelectric capacitor Cs. A gate of the selection transistor is connected to the word line $WL_i$. A drain of the selection transistor is connected to a bit line BL or a complimentary bit line $\overline{BL}$, and another drain of the selection transistor is connected to the storage capacitor Cs.

Figure 1:
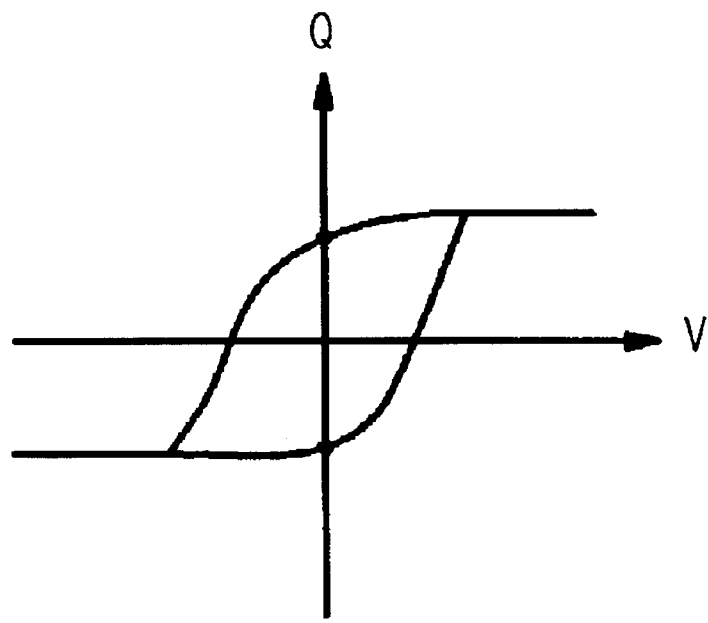
FIG. 1 shows a graph for illustrating a hysteresis characteristic curve of conventional ferroelectric film.
Figure 2:
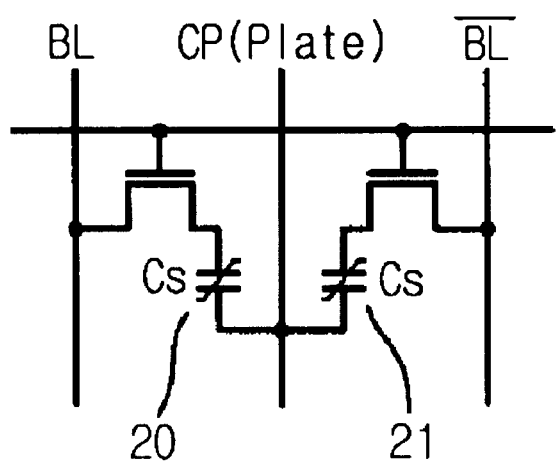
FIG. 2 shows a schematic diagram illustrating a conventional 2T2C ferroelectric memory cell.
Figure 3:
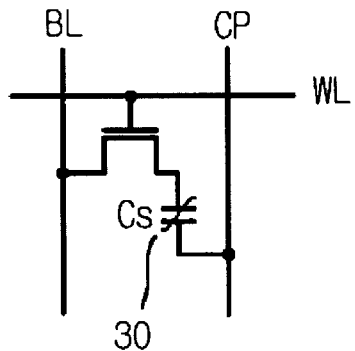
FIG. 3 shows a schematic diagram illustrating a conventional 1T1C ferroelectric memory cell.
Figure 7:
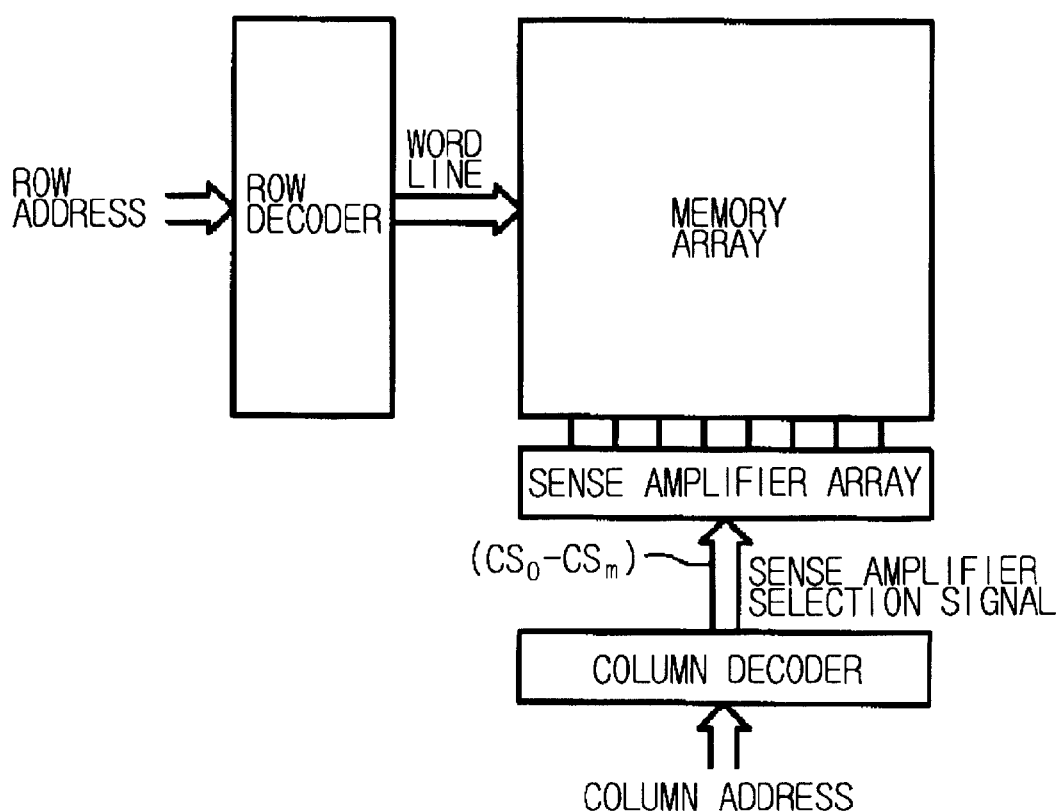
FIG. 7 shows a block diagram illustrating an application of selection signals of reference cells shown in FIG. 5.
Figure 4:
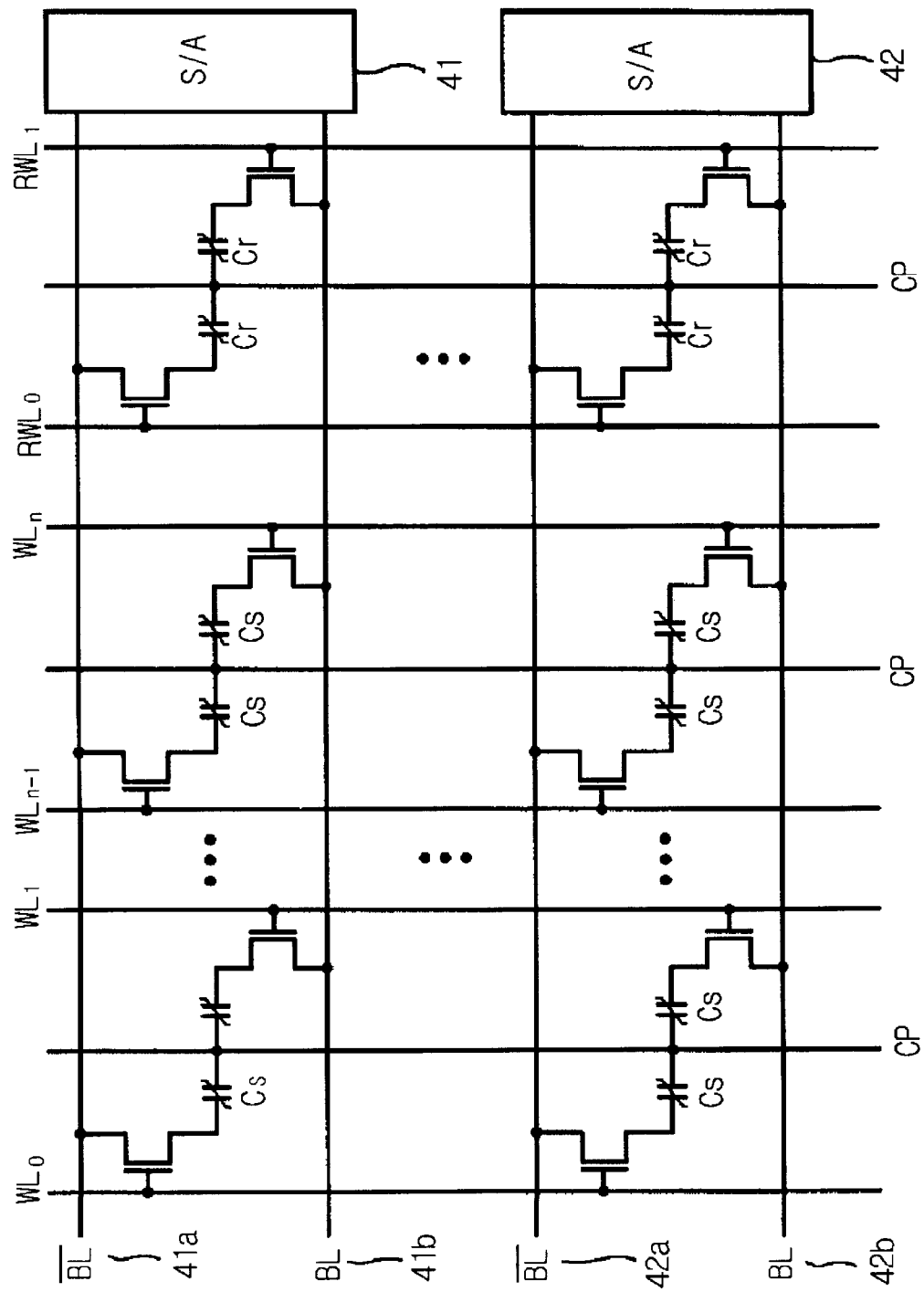
FIG. 4 shows a schematic diagram illustrating a structure of the memory array comprised of memory cells shown in FIG. 3.
Figure 8:
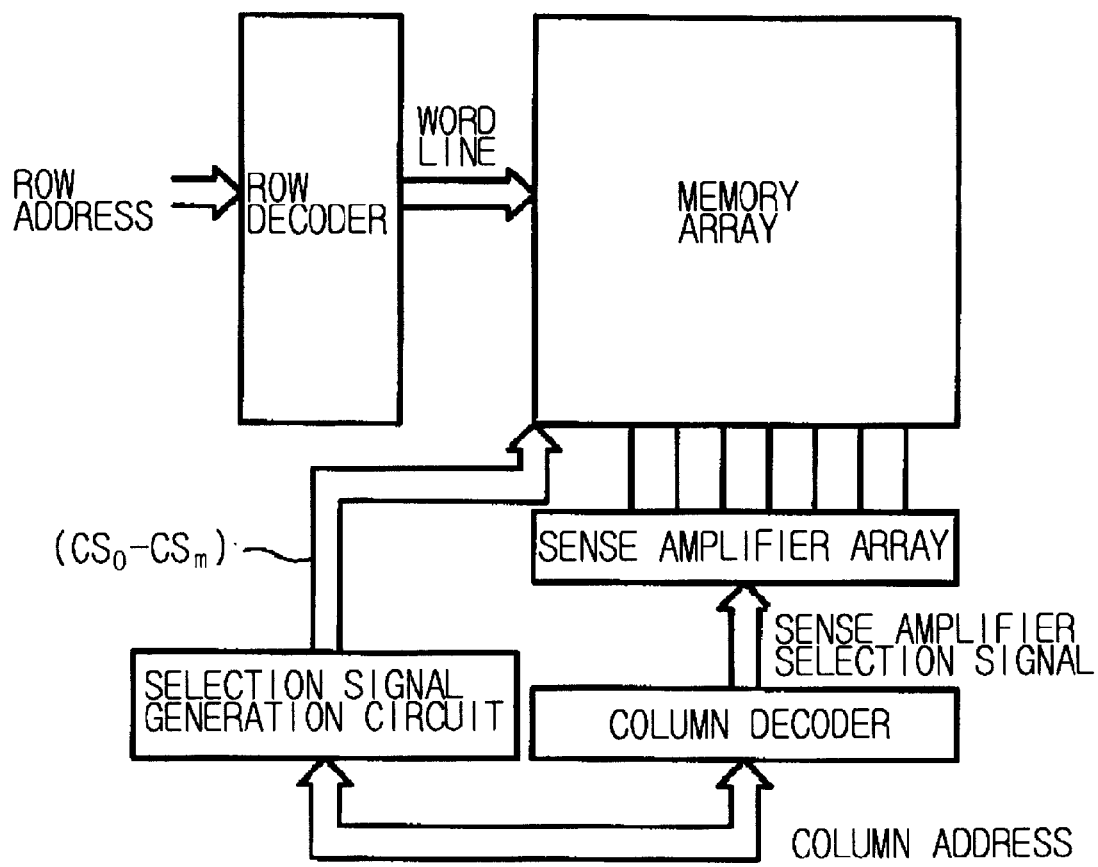
FIG. 8 shows a block diagram illustrating an application of selection signals of reference cells shown in FIG. 5.

Each reference cell comprises a selection transistor MB such as a MOS transistor and a reference ferroelectric capacitor Cr. A drain of the selection transistor MB is connected to a bit line BL or a complimentary bit line $\overline{BL}$, and another drain of the selection transistor MB is connected to the reference capacitor Cr. A gate of the selection transistor MB is connected to an output of a logic AND gate. Two input signals are supplied to the AND gate. One of them is a word line selection signal (WLSS) from a reference cell word line $RWL_i$, and the other of them is a reference cell selection signal (RCSS) $CS_0, \ldots$ or $CS_m$. The selection transistor MB is turned on only when both WLSS and RCSS are enabled. As shown FIG. 7, a sense amplifier selection signal decoded from a column address by a column decoder can be used as RCSS. In order to avoid probable and undesirable delay owing to using the sense amplifier selection signal as RCSS, RCSS can be directly generated from the column address using a selection signal generation circuit as shown in FIG. 8.

Referring to FIG. 5, the operation of a nonvolatile ferroelectric memory of the present invention is explained.

When one of word lines $WL_0$ through $WL_1$ connected to the memory cells is selected, one of word lines $RWL_0$ and $RWL_1$ connected to the reference cells is selected.

If an even numbered memory cell word line $WL_0, \ldots$ or $WL_{n-1}$ is selected, complimentary bit lines ($\overline{BL}$) $51a$ and $52a$ connected to the memory cells associated with the selected word line $WL_0, \ldots WL_{n-1}$ are activated depending on the charge of each storage capacitor Cs. At this time, one reference cell word line $RWL_1$ is selected, and then WLSS is enabled at one input of every AND gate associated with the selected word line $RWL_1$. When some of sense amplifiers 51 through 52 are selected, RCSS is enabled at the other input of every AND gate associated with the selected sense amplifiers. That is, in the case that only a sense amplifier 51 is selected, RCSS $CS_0$ at inputs of AND gates in only two reference cells associated with the sense amplifier 51 is enabled. Then, only an AND gate, to which both enabled WLSS and enabled RCSS are provided from the word line $RWL_1$ and the column adress, can activate the selection transistor MB to supply the reference voltage to a bit line (BL) $51b$ depending on the charge of the reference capacitor Cr. The selected sense amplifier 51 compares voltage levels of a pair of bit lines $51a$ and $51b$, and then amplifies the voltage difference in order to read and determine whether the information stored in the selected memory cell is "1" or "0".

If an odd numbered memory cell word line $WL_1, \ldots$ or $WL_{n-1}$ is selected, bit lines (BL) $51b$ and $52b$ connected to the memory cells associated with the selected word line $WL_1, \ldots$ or $WL_n$ are activated depending on the charge of each storage capacitor Cs. At this time, the other reference cell word line $RWL_0$ is selected, and then WLSS is enabled at one input of every AND gate associated with the selected word line $RWL_0$. In the case that only a sense amplifier 52 is selected, RCSS $CS_m$ at inputs of AND gates in only two reference cells associated with the sense amplifier 52 is enabled. Then, only an AND gate, to which both enabled WLSS and enabled RCSS are provided from the word line $RWL_0$ and the column adress, can activate the MOS transistor MB to supply the reference voltage to a complimentary bit line ($\overline{BL}$) $52a$ depending on the charge of the reference capacitor Cr. The sense amplifier 52 compares voltage levels of a pair of bit lines $52a$ and $52b$, and then amplifies the voltage difference in order to read and determine whether the information stored in the selected memory cell is "1" or "0".

It is noted that in the nonvolatile ferroelectric memory in accordance with the present invention, the selection transistor MB of the reference cell is turned on only when both WLSS and RCSS are enabled. The selection transistors MB and ferroelectric reference capacitors Cr of the reference cells associated with the non-selected sense amplifiers are not operated. That is, when a memory cell is accessed in the nonvolatile ferroelectric memory in accordance with the present invention, cases in which reference cells are unnecessarily operated are prevented preliminarily and therefore the number of voltage cycles loaded to the reference cell decreases. As the number of voltage cycles decreases, the amount of fatigue accumulated on the ferroelectric capacitor Cr decreases. This results in a reduction of the thin film of the reference cell as well and overall lifetime of the memory is improved.

Figure 6:
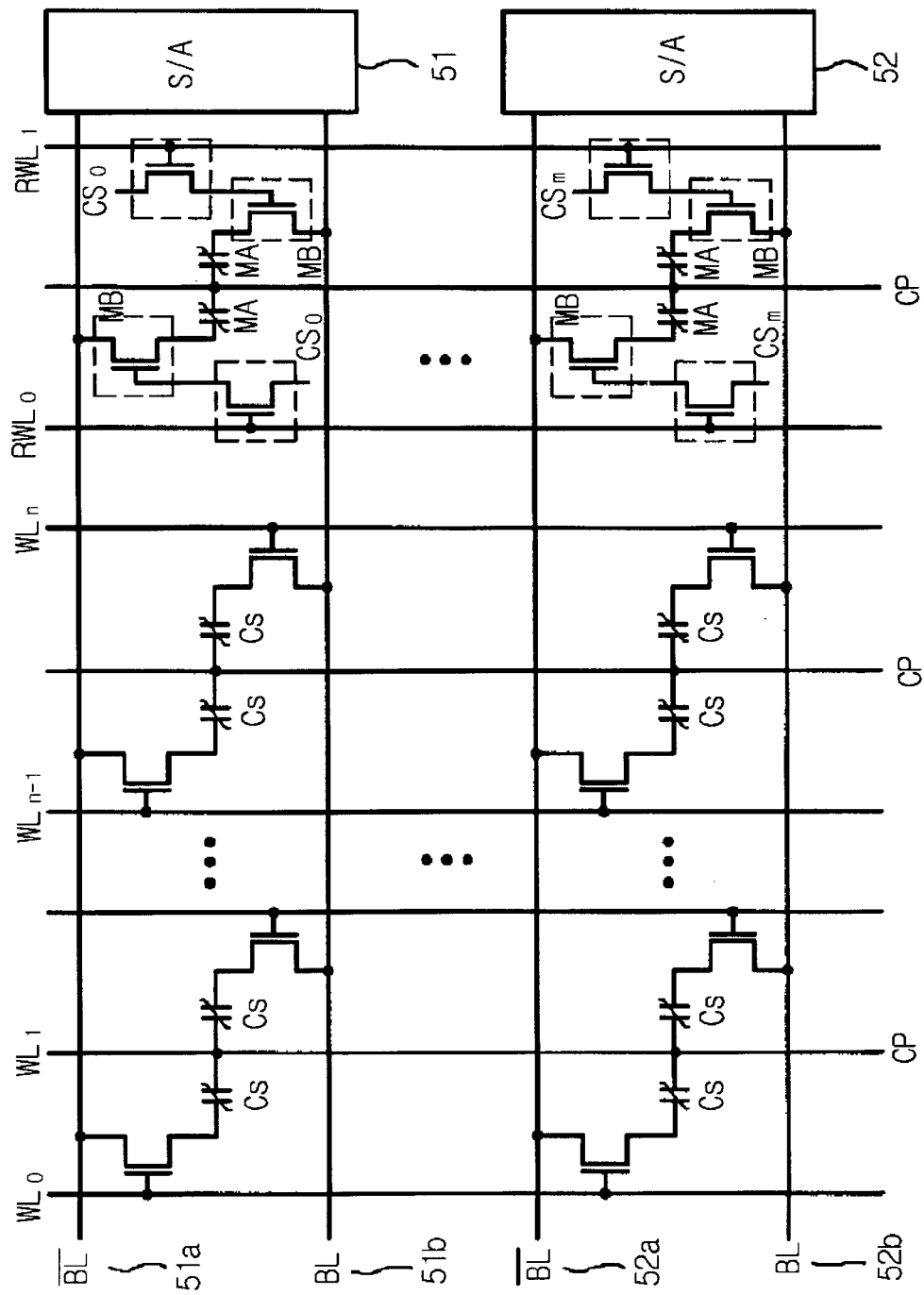
FIG. 6 shows a schematic diagram illustrating a ferroelectric memory array in accordance with other embodiment of the present invention.

FIG. 6 is a schematic diagram illustrating a ferroelectric memory array in accordance with another preferred embodiment of the present invention. In this embodiment, a MOS transistor MA is employed instead of an AND gate for selectively activating the MOS transistor MB in the embodiment shown in FIG. 5.

The gate of each selection transistor MA is connected to one of the reference cell word lines $RWL_0$ and $RWL_1$. RCSS is provided to the drain of every selection transistor MA.

Since the selection transistor MA is turned on only when WLSS provided from the word line $RWL_0$ or $RWL_1$, and operates to apply an activation signal to the MOS transistor MB only when RCSS $CS_0$ or $CS_m$ provided to the drain is enabled. This operation of the selection transistor MA is leaded to the same result with that of the logic AND gate. Operation of the memory according to this embodiment other than the selection transistor's operation is the same with that of the memory according to the embodiment shown in FIG. 5.

Because a nonvolatile ferroelectric memory in this embodiment employs only one MOS transistor for logic AND gate implementation, the space allocated for logic gates can be reduced.

As explained above, the nonvolatile ferroelectric memory in accordance with the present invention provides ways to operate only necessary reference cells for sense operation when read/write operations of memory cells are required. Therefore, the fatigue accumulated on the reference cells is reduced and overall lifetime of the memory cell is increased. That is, in the nonvolatile ferroelectric memory in accordance with the present invention, the selection transistor is connected with the selected sense amplifier and information in the reference cells is read by turning on the selection transistor of the reference cell. As a result, the number of cycles of the reference cells is reduced and the lifetime of the device increases.

Although several preferred embodiments of the present invention have been disclosed for illustrative purpose, those who are skilled in the art will appreciate that various modifications, additions and substitutions are possible without departing from the scope and spirit of the present invention as defined in the accompanying claims.

What we claim:

1. A nonvolatile ferroelectric memory, comprising:
    a plurality of cells, said cells arranged in a matrix form and including memory cells and reference cells; and
    a plurality of sense amplifiers arranged in a row of the matrix, in which each sense amplifier compares voltages induced from a reference cell and a selected memory cell to read information stored in the selected memory cell,
    wherein each reference cell is activated only when both a selection signal from a column address and a word line connected to said reference cell are enabled.

2. The nonvolatile ferroelectric memory of claim 1, wherein each reference cell comprises a ferroelectric capacity, a transistor operating to provide a voltage to said sense amplifier depending on the charge of said ferroelectric capacity, and a logic AND gate operating to turn on said transistor only when both said selection signal from said column address and said word line connected to said reference cell are enabled.

3. The nonvolatile ferroelectric memory of claim 1, wherein each reference cell comprises a ferroelectric capacity, a first transistor operating to provide a voltage to said sense amplifier depending on the charge of said ferroelectric capacity, and a second transistor operating to turn on said first transistor only when both said selection signal from said column address and said word line connected to said reference cell are enabled.

4. The nonvolatile ferroelectric memory of claim 2, wherein each column of the matrix is comprised of a sense amplifier, two reference cells, a plurality of memory cells and a pair of bit lines connected to said sense amplifier, said sense amplifier receiving a voltage from a selected memory cell through one of said bit lines and a voltage from a selected reference cell through the other of said bit lines.

5. The nonvolatile ferroelectric memory of claim 4, wherein one half of the memory cells are connected to one of said bit lines, the other half of the memory cells are connected to the other of said bit lines; and wherein one of the reference cells is connected to one of said bit lines, the other of the reference cells is connected to the other of said bit lines.

6. The nonvolatile ferroelectric memory of claim 2, wherein a MOS transistor is used as said transistor.

7. The nonvolatile ferroelectric memory of claim 3, wherein each column of the matrix is comprised of a sense amplifier, two reference cells, a plurality of memory cells and a pair of bit lines connected to said sense amplifier, said sense amplifier receiving a voltage from a selected memory cell through one of said bit lines and a voltage from a selected reference cell through the other of said bit lines.

8. The nonvolatile ferroelectric memory of claim 7, wherein one half of the memory cells are connected to one of said bit lines, the other half of the memory cells are connected to the other of said bit lines; and wherein one of the reference cells is connected to one of said bit lines, the other of the reference cells is connected to the other of said bit lines.

9. The nonvolatile ferroelectric memory of claim 3, wherein a MOS transistor is used as said first and second transistors.

10. The nonvolatile ferroelectric memory of claim 1, wherein said selection signal from said column address is obtained by a sense amplifier selection signal decoded from said column address.

11. The nonvolatile ferroelectric memory of claim 1, wherein said selection signal from said column address is generated using a selection signal generation circuit.

* * * * *